United States Patent
O'Brien et al.

(12) 
(10) Patent No.: US 6,245,435 B1
(45) Date of Patent: Jun. 12, 2001

(54) DECORATIVE CORROSION AND ABRASION RESISTANT COATING

(75) Inventors: Timothy J. O'Brien, Bay Village; Inho Song, Mayfield Heights; Brenda L. Trautman, Avon, all of OH (US); Brian S. Bubar, Apex, NC (US); Darrell K. May, Ramsuer, NC (US); Joseph E. Preston, Sanford, NC (US); James G. Sheek, Sanford, NC (US); Jeffrey D. Wilder, Sanford, NC (US)

(73) Assignee: Moen Incorporated, North Olmsted, OH (US)

( * ) Notice: Subject to any disclaimer, the term of this patent is extended or adjusted under 35 U.S.C. 154(b) by 0 days.

(21) Appl. No.: 09/259,341

(22) Filed: Mar. 1, 1999

(51) Int. Cl.$^7$ .......................................................... B32B 7/00
(52) U.S. Cl. ........................ 428/472; 428/469; 428/697; 428/698; 428/701; 428/702; 428/627
(58) Field of Search ..................................... 428/697, 698, 428/701, 702, 472, 469, 627

(56) References Cited

U.S. PATENT DOCUMENTS

| | | |
|---|---|---|
| Re. 33,530 | 2/1991 | Munz et al. . |
| 3,958,070 * | 5/1976 | Schintlmeister et al. ............ 428/457 |
| 4,209,552 | 6/1980 | Welch . |
| 4,219,199 | 8/1980 | Okuda . |
| 4,296,178 * | 10/1981 | Griesenauer et al. ................ 428/457 |
| 4,351,855 | 9/1982 | Pinkhasov . |
| 4,369,225 | 1/1983 | Manabe et al. . |
| 4,395,313 | 7/1983 | Lindsay et al. . |
| 4,402,998 | 9/1983 | Kumagai et al. . |
| 4,407,998 | 10/1983 | Duvdevani . |
| 4,415,421 | 11/1983 | Sasanuma . |
| 4,420,498 | 12/1983 | Hirose et al. . |
| 4,426,267 | 1/1984 | Munz et al. . |
| 4,431,711 | 2/1984 | Eisfeller . |

(List continued on next page.)

FOREIGN PATENT DOCUMENTS

| | | |
|---|---|---|
| 0 353 060 * | 1/1990 | (EP) . |
| 0 430 874 A1 | 6/1991 | (EP) . |
| 2 173 218 | 10/1986 | (GB) . |
| 3-240942 | 10/1991 | (JP) . |

OTHER PUBLICATIONS

Schulz, S. "Decorative Coating with Physical Coating Processes," Leybold AG Technical Pubn. 11–S36.02, Hanau, Germany (no date).

Schulz, S., "New Directions in Decorative Hard Coatings," Leybold AG Technical Pubn. 11–S37.02 presented at Deco–Symposium Japan, Kyoto, Japan, Jul. 12, 1990, Hanau, Germany.

Schulz, S., "What You Ever Wanted to Know About Deco Coatings," Leybold AG Newsletter, Alzenau, Germany, Feb. 1991.

(List continued on next page.)

*Primary Examiner*—Archene Turner
(74) *Attorney, Agent, or Firm*—Cook, Alex, McFarron, Manzo, Cummings & Mehler, Ltd.

(57) ABSTRACT

A new article of manufacture, for example a faucet or other article of hardware, has a specified decorative color, other than brass, and is resistant to corrosion, abrasion and attack by chemicals. The article includes a substrate, one or more corrosion resistant layers applied to the substrate, and an outer layer, applied by PVD, and chosen from only one or more of Zr, Hf, C and N. The outer layer provides the desired, other than brass, color of the article, the desired chemical and abrasion resistance, and which layer, when in contact with air or water becomes passive in a manner similar to chrome.

20 Claims, 1 Drawing Sheet

U.S. PATENT DOCUMENTS

| | | |
|---|---|---|
| 4,438,153 | 3/1984 | Pinkhasov . |
| 4,447,473 | 5/1984 | Mashida et al. . |
| 4,466,872 | 8/1984 | Einbinder . |
| 4,470,895 | 9/1984 | Coad et al. . |
| 4,517,217 | 5/1985 | Hoffman . |
| 4,524,106 | 6/1985 | Flasck . |
| 4,544,468 | 10/1985 | Munz et al. . |
| 4,582,564 | 4/1986 | Shanefield et al. . |
| 4,590,031 | 5/1986 | Eichen et al. . |
| 4,591,418 | 5/1986 | Snyder . |
| 4,603,057 | 7/1986 | Ueno et al. . |
| 4,604,168 | 8/1986 | Liu et al. . |
| 4,606,941 | 8/1986 | Jenkin . |
| 4,612,216 | 9/1986 | Kurfman . |
| 4,620,913 | 11/1986 | Bergman . |
| 4,629,662 | 12/1986 | Brownlow et al. . |
| 4,713,150 | 12/1987 | Hornbostel et al. . |
| 4,716,083 | 12/1987 | Eichen et al. . |
| 4,737,252 | 4/1988 | Hoffman . |
| 4,763,601 | 8/1988 | Saida et al. . |
| 4,824,540 | 4/1989 | Stuart . |
| 4,842,945 | 6/1989 | Ito et al. . |
| 4,849,082 | 7/1989 | Baty et al. . |
| 4,876,119 | 10/1989 | Takeda et al. . |
| 4,882,022 | 11/1989 | Hoffman et al. . |
| 4,895,630 | 1/1990 | Aufderheide . |
| 4,900,630 * | 2/1990 | Suzuki et al. .......................... 428/699 |
| 4,911,811 | 3/1990 | Mullaney, Jr. . |
| 4,919,773 * | 4/1990 | Naik ..................................... 204/38.4 |
| 4,937,094 | 6/1990 | Doehler et al. . |
| 4,950,365 | 8/1990 | Evans . |
| 4,973,388 * | 11/1990 | Francois et al. ..................... 204/38.4 |
| 5,015,308 | 5/1991 | Yamagata . |
| 5,022,978 | 6/1991 | Hensel et al. . |
| 5,055,318 | 10/1991 | Deutchman et al. . |
| 5,091,209 | 2/1992 | Claverie et al. . |
| 5,126,030 | 6/1992 | Tamagaki et al. . |
| 5,234,560 | 8/1993 | Kadlec et al. . |
| 5,234,561 | 8/1993 | Randhawa et al. . |
| 5,366,764 | 11/1994 | Sunthankar . |
| 5,374,451 | 12/1994 | Servais et al. . |
| 5,407,548 | 4/1995 | Kopacz et al. . |
| 5,413,874 | 5/1995 | Moysan, III et al. . |
| 5,429,070 | 7/1995 | Campbell et al. . |
| 5,447,803 | 9/1995 | Nagaoka et al. . |
| 5,458,754 | 10/1995 | Sathrum et al. . |
| 5,458,928 * | 10/1995 | Kiyama et al. ....................... 427/530 |
| 5,476,724 | 12/1995 | Moysan, III et al. . |
| 5,478,659 | 12/1995 | Moysan, III et al. . |
| 5,478,660 | 12/1995 | Moysan, III et al. . |
| 5,482,788 | 1/1996 | Moysan, III et al. . |
| 5,484,663 | 1/1996 | Moysan, III et al. . |
| 5,492,725 | 2/1996 | Gordon . |
| 5,510,012 | 4/1996 | Schulz et al. . |
| 5,512,164 | 4/1996 | Timberlake . |
| 5,543,183 | 8/1996 | Streckert et al. . |
| 5,552,233 | 9/1996 | Moysan, III et al. . |
| 5,624,486 | 4/1997 | Schmid et al. . |
| 5,626,972 | 5/1997 | Moysan, III et al. . |
| 5,639,564 | 6/1997 | Moysan, III et al. . |
| 5,641,579 | 6/1997 | Moysan, III et al. . |
| 5,648,179 | 7/1997 | Moysan, III et al. . |
| 5,654,108 | 8/1997 | Moysan, III et al. . |
| 5,667,904 | 9/1997 | Moysan, III et al. . |
| 5,683,756 | 11/1997 | Tanner et al. . |
| 5,693,427 | 12/1997 | Moysan, III et al. . |
| 5,705,230 | 1/1998 | Matanabe et al. . |
| 5,716,721 | 2/1998 | Moysan, III et al. . |
| 5,720,821 | 2/1998 | Halpern . |
| 5,752,395 * | 5/1998 | Nakamura ............................... 63/34 |
| 5,759,677 | 6/1998 | Fink . |
| 5,773,154 | 6/1998 | Takada . |
| 5,783,313 | 7/1998 | Moysan, III et al. . |
| 5,788,823 | 8/1998 | Warnes et al. . |
| 5,798,148 | 8/1998 | Thomas et al. . |
| 5,814,415 | 9/1998 | Moysan, III et al. . |
| 5,858,181 | 1/1999 | Jindal et al. . |
| 5,879,532 | 3/1999 | Foster et al. . |
| 5,891,556 | 4/1999 | Anderson et al. . |
| 5,897,753 | 4/1999 | Schatz et al. . |
| 5,976,634 | 11/1999 | Tanner et al. . |

OTHER PUBLICATIONS

Brown, Richard, and Alias, Mohd. N., "Oxidation of Nitride Films in Aqueous Solution: Correlation Between Surface Surface Analysis and Electrochemical Studies," University of Rhode Island Paper No. 322, presented at the Annual Conference and Corrosion Show, 1994 (no month).

Van Leaven, L., Alias, M. N. and Brown, R., "Corrosion Behavior of Ion Plated and Implanted Films," Surface and Coatings Technology, 53 (1992) pp. 25–34 (no month).

Ristolainin, E.O., Molarius, J.M., Korhonen, A.S., and Lindroos, V.K., "A Study of Nitrogen–rich Titanium and Zirconium Nitride Films," J.Vac.Sci, Technol.A vol.5 No.4 Jul./Aug. 1987 (pp. 2184–2189), USA.

Johansson, B.O., Hentzell, H.T.G., Harper, J.M.E. and Cuomo, J.J., "Higher Nitrides of Hafnium, Zirconium, and Titanium Synthesized by Dual Ion Beam Deposition," J. Mater.Res., vol. 1, No. 3, May/Jun. 1986, pp. 445–451, USA.

Jehn, Von H.A., Pfeifer–Schaller, I., and Baumgartner, M.E., "Corrosion of Hard Coatings," Galvanotechnik 84 (1993) Nr. 12, pp. 4059–4964, Saulgau, Germany (no month).

* cited by examiner

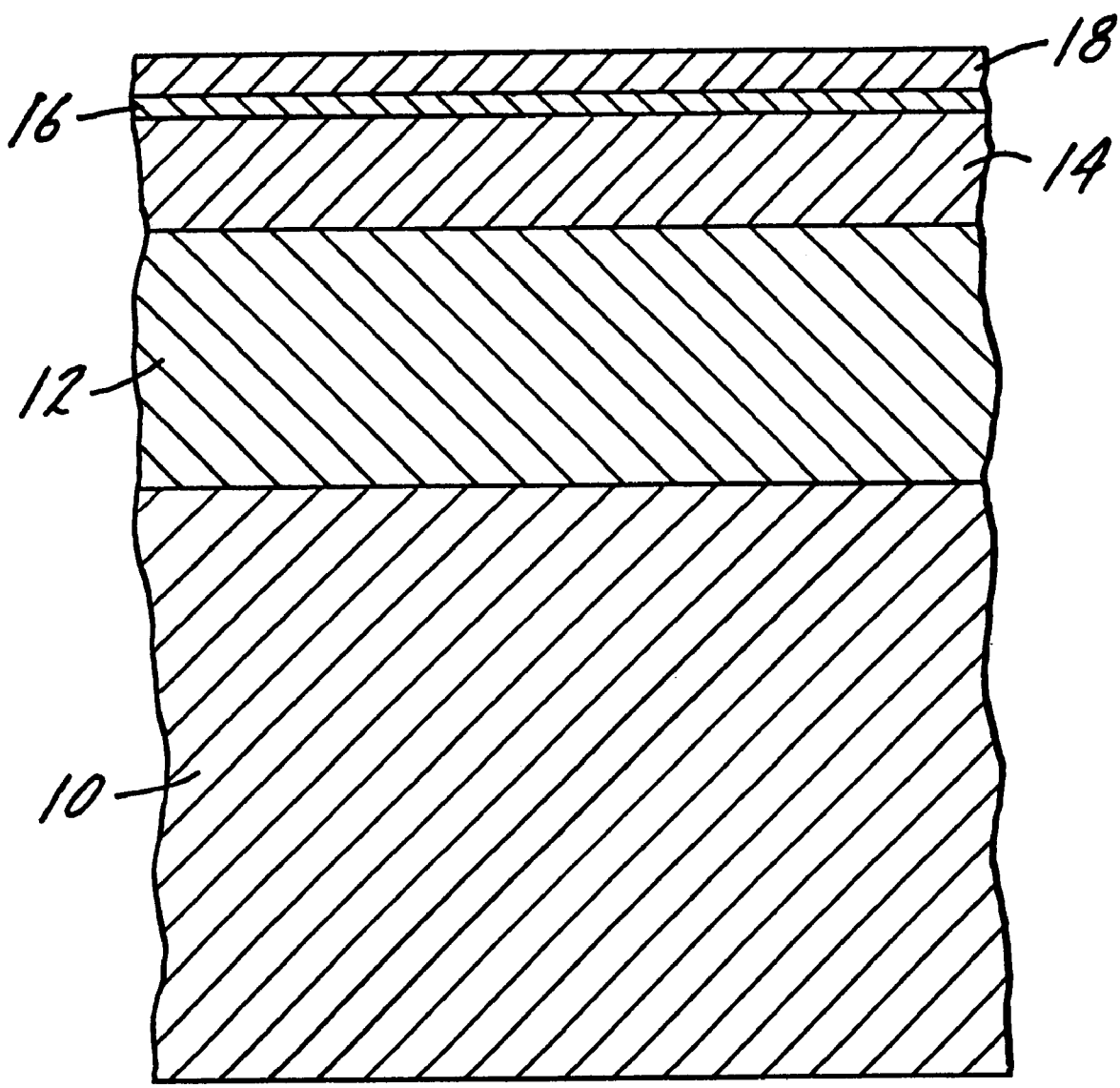

DECORATIVE CORROSION AND ABRASION RESISTANT COATING

THE FIELD OF THE INVENTION

The present invention relates to decorative coatings for articles of manufacture such as faucets and related plumbing products including shower heads, escutcheons, tub spouts and the like. More specifically, the invention concerns a decorative coating for such a product, which is resistant to corrosion, abrasion and attack by chemicals, and has a specified decorative color other than brass. The invention is particularly concerned with such a decorative coating which resists corrosion, a common problem in many present-day decorative coatings, and uses only zirconium or hafnium as the principal component of the outer decorative layer. There are numerous prior art patents which disclose the use of zirconium to provide a corrosion resistant brass appearing decorative outer coating. However, attempts to apply the principles of such prior art disclosures to provide colors other than brass, through use of principal components for the outer coating other than zirconium or hafnium, have all resulted in failure. The present invention provides such a coating in which the color is other than brass, for example gray, gold or black, but uses zirconium or hafnium as the principal component of the outer layer, with the parameters of the physical vapor deposition process (PVD) being manipulated to provide an outer layer which has the desired resistance to corrosion, abrasion and attack from chemicals.

SUMMARY OF THE INVENTION

The present invention relates to articles of manufacture with a decorative coating other than brass and more specifically to such a coating which is resistant to corrosion, abrasion and attack by chemicals.

A primary purpose of the invention is to provide a new article of manufacture which has a specified decorative color, for example gray, gold or black, and includes an outer layer which has as a principal component only zirconium or hafnium.

Another purpose is an article of manufacture of the type described in which the outer layer applied by physical vapor deposition can provide different colors, depending upon the specific parameters of the deposition process, through the use of only zirconium or hafnium as the principal component of the outer layer.

Another purpose is an article of manufacture of the type described in which the substrate is essentially free of surface flaws and porosity and is chosen from the group comprising brass, a metal glass and zinc castings produced by a semi-solid or slush casting process.

Another purpose is a corrosion resistant article of manufacture of the type described, for example door hardware, or a faucet or related plumbing component, having enhanced corrosion resistance by the maintenance of a passivating layer on the exterior thereof.

Other purposes will appear in the ensuing specification, drawing and claims.

BRIEF DESCRIPTION OF THE DRAWINGS

The invention is illustrated diagrammatically in the attached drawing which illustrates a portion of an article of manufacture.

DESCRIPTION OF THE PREFERRED EMBODIMENT

Many household objects, for example faucets and related plumbing products, include components which are designed to have both decorative and functional aspects. Frequently, such components consist first of a substrate, which establishes the shape and mechanical function, and second, of a finish which provides the decorative aspect of the article, resistance to corrosion or tarnish, resistance to chemical attack, resistance to abrasion or impact, or a combination of these enhancements. Usually the finish consists of a stack of one or more layers of material which are thin relative to the dimensions of the substrate. A finishing process consists generally of the steps necessary to apply the layers, plus some other intermediate steps in which the surface is cleaned or the surface texture or chemical properties are altered by physical or chemical means.

Until approximately 1980 the most well established decorative finishing processes were electroplating and painting with liquid or powder polymer systems. More recently new classes of finishing processes have appeared which rely on new technology, frequently involving the use of a vacuum chamber or pressure vessel. The list of such modern processes includes PVD, CVD, PECVD, ion plating and MOCVD. Physical vapor deposition (PVD) is a collective name for a class of processes which have become particularly popular in the U.S. in the 1990s for application of a durable, scratch resistant polished brass finish to zinc, plastic, steel or brass substrates. U.S. Pat. 5,759,677 owned by Moen Incorporated, the assignee of the present application, describes one such process for providing a brass appearing durable finish on a substrate such as a faucet. U.S. Pat. Nos. 5,814,415, 5,783,313, 5,716,721, 5,693,427, 5,667,904, 5,654,108, 5,648,179, 5,641,579, 5,639,564, 5,626,972, 5,552,233, 5,484,663, 5,482,788, 5,478,660, 5,478,659, 5,476,724 and 5,413,874, owned by Baldwin Hardware Corp. of Reading, Pa., describe a series of processes which are focused toward corrosion protection and providing a brass appearing decorative finish for various types of hardware products. The specific parameters used in such processes and described in the patents are herein incorporated by reference, as they provide technology to those skilled relative to the use of PVD processes.

The above patents describe the use of compounds of zirconium with nitrogen and carbon to create a PVD polished brass finish. Commonly the PVD layer furnishes color, scratch resistance and resistance to chemical attack. On metallic substrates a separate electroplated layer system commonly is furnished under the PVD layer or layers to provide corrosion resistance. The electroplated system usually consists of a standard chrome electroplate system and sometimes of a more expensive alternative such as nickel, duplex nickel, palladium nickel, tin nickel or nickel boron and tungsten, the details of which are disclosed in the above-described Baldwin Hardware patents. PVD ZrN polished brass is only one member of a very large class of color finishes that can be created using the PVD process with one or more metals and process gases containing nitrogen, carbon, hydrogen, argon and oxygen.

It has recently been determined that the ZrN finish is unusual in that it provides acceptable corrosion performance when applied to corrosion sensitive substrates such as zinc, in conjunction with a chrome electroplate corrosion barrier system. In the past, ZrN has only been used to provide a brass appearing substrate. The present invention is specifically focused on processes, and articles of manufacture made thereby, in which ZrN, ZrCN, HfN and HfCN can be used to provide colors other than brass and yet retain the corrosion performance which has been determined to be provided by ZrN. It has also been determined that the use of other metals in the finish decorative layer, such as titanium, aluminum or chromium will actually degrade the corrosion resistance performance of the entire coating. Thus, the present invention is specifically directed to maintaining corrosion performance, through the use of only Zr and Hf as the principal components of the outer layer, but yet providing various colors other than brass by manipulation of the process parameters.

The prior art, with respect to corrosion protection of metallic corrosion sensitive substrates, can be summarized using the example of chrome electroplate on a zinc die casting. Many household objects, such as faucets or door handle sets, contain decorative components consisting of a zinc die cast substrate or plastic injection molded substrate which is protected by a finish comprising a stack of copper, nickel and chrome electroplating layers. In this finish system, the function of the copper layer (also known as the "cyanide copper" layer or "strike" layer) is to promote good adhesion between the substrate and subsequent layers. The function of the nickel layer or layers is to provide a measure of corrosion protection and create the desired surface texture, commonly a mirror-bright reflective surface. The purpose of the chrome layer is to provide the desired color, to provide the desired abrasion resistance, to provide the desired resistance to noxious chemicals such as strong acid or alkali commonly found in household cleaners, and to further improve the corrosion resistance of the combination. In a well known variant of the basic scheme described above, a thicker copper layer known as an "acid copper" layer, may be interleaved between the copper strike and the nickel layers. The function of the acid copper layer is, inter alia, "leveling"; to cover over completely the preceding layers, to close up any cracks or pores in the layers below, and to smooth over any roughness in the surface.

Chrome is particularly useful for corrosion protection and chemical resistance because it readily forms a tenacious and chemically inert oxide layer. The oxide layer is electrically insulating, or at least has a very high electrical resistance, and is present at all points on the surface of the chrome material.

When a portion of the chrome oxide film is removed by mechanical damage such as a nick or abrasion, new chrome oxide forms spontaneously at the exposed metal in almost all chemical environments. Consequently, the insulating oxide layer has a self-healing property and therefore under normal conditions always covers the surface of the chrome metal completely. Such an oxide layer is commonly referred to as a "passivating" oxide film by those skilled in this art.

When metals corrode, a chemical reaction takes place in which electrically neutral atoms are converted to positively charged metal ions at a region usually termed an "anode site." Electrons are left behind on the anode and flow to a "cathode site," where they are consumed by a complementary chemical reaction. This electron transfer phenomenon distinguishes electrochemical reactions from merely chemical reactions in which the electron-producing and electron-consuming reactions occur at the same site.

When electrodes fashioned from two different metals are immersed in an electrolyte and connected by a conducting bridge, electrons flow through the bridge in the circuit thus created from the anode to the cathode. The electrical cell thus formed has a characteristic voltage which can be determined by applying a variable countervailing voltage and observing the magnitude of the countervailing voltage required to reduce the current in the circuit to zero.

It is possible to construct a ranking system, known as the "galvanic series," by selecting a standard electrode material and a standard electrolyte, immersing electrodes of a series of different metals in the electrolyte, connecting to the standard electrode via a conducting bridge, and observing the cell polarity and characteristic voltage as above.

At one end of the galvanic series are found "noble" metals such as gold. At the opposite end are "base" metals such as zinc. When an electrochemical cell is constructed using a standard electrolyte, a noble metal electrode and a base metal electrode, the noble metal becomes the cathode and the base metal becomes the anode. If the anode subsequently is replaced by a new anode of a still more base metal, the voltage and current observed in to the cell increase and the rate of corrosion at the new anode is greater than the corrosion rate at the original anode. This assumes that there is no difference in the valence of the positive ions generated at the two anodes and that the two cells have similar polarization characteristics.

In normal circumstances, a passivating oxide film has a highly beneficial effect on corrosion because it increases the electrical resistance of the circuit between the anodic and cathodic reaction sites, or the substrate and exterior coating in the environment disclosed herein. Consequently, the "corrosion current" is reduced, and the rate of corrosion is much lower than that found if the passivating oxide film is removed. This is one reason why chrome plate is such an effective corrosion-preventing finish. With chrome as a portion of the finish stack of materials, there will be a passivating oxide film.

The simplest version of the chrome plated decorative finish suffers from a phenomenon known as the "large cathode area effect" which accelerates a failure mechanism known as "pitting corrosion." Almost all chrome-plated articles will contain a few minute defects in the chrome plating such as pits, voids or cracks, where the underlying nickel layer is exposed. In normal corrosion, these local defects are the sites of anodic reaction, whereby the metallic nickel is transformed into positive nickel ions. Unfortunately, the cathodic sites are not constrained in the same manner, but can be present anywhere on the metallic chrome surface.

Since the total cathode area is much larger than the total anode area, and every electron consumed on a cathode must be produced at an anode, corrosion progresses rapidly at each anode site and a pit or crack tends to develop. When the pit penetrates fully through the nickel to the zinc substrate, zinc replaces nickel as the anode material. Since zinc is a metal which is significantly more base than nickel, the corrosion then proceeds even more rapidly than the former nickel corrosion. A characteristic solid corrosion product of zinc, commonly known as "white rust," is emitted from the corrosion site. Frequently, the white rust fills the original corrosion pit in the nickel, pushing out the chrome plate layer above and creating a corrosion blister. If the substrate is brass rather than zinc, the same process takes place, but the rate of production of white rust is reduced because the chemical activity of zinc in brass is lower than its activity in the pure state.

Several strategies are available to minimize problems in chrome plate created by the large cathode area effect or pitting corrosion. The simplest strategy consists simply of increasing the total nickel thickness until the desired corrosion resistance is obtained. In a second, more effective strategy, the "bright nickel" electroplate layer underlying the chrome is replaced by a "duplex" layer. The duplex layer consists of standard, bright nickel topped with a second layer which is more base (electronegative) than the bright nickel layer. The increased electronegativity is usually achieved by arranging for the extra layer to have a much higher sulfur content than the standard bright nickel layer. After a corrosion pit penetrates through the high sulfur layer, subsequent corrosion tends to occur laterally within the high-sulfur nickel layer, rather than penetrating through the bright nickel layer to the zinc below. Thus, the second accelerated stage of corrosion, with development of white rust and blistering, is prevented.

A third and still more effective strategy relies on the deliberate introduction of a vast number of tiny defects in the chrome plate, on a scale too small to be detected by the naked eye. The nickel exposed at these defects forms a "distributed anode" which greatly mitigates the cathode area effect noted previously. Moreover, corrosion is now spread over the whole surface of the casting instead of being concentrated at a few pits. The rate of corrosion at each pore or crack in the distributed anode is so low that few deep pits form and fewer still penetrate to the zinc substrate.

Chrome plating is an excellent example of a "balanced" corrosion protection system in which the cathode and anode areas are not too dissimilar, the cathode and anode electrode potentials are not too different, neither the cathode nor the anode has an inherent tendency to corrode at too high a rate, and any corrosion that does occur is slowed by the presence of the high-resistance passivating film, chrome oxide. Most other finishes tend to rely simply on sealing the article vulnerable to corrosion within a defect free barrier coating. The barrier coating may be a relatively noble metal, such as the palladium/nickel alloys referenced in the above patents of Baldwin Hardware, or an insulator such as a clear epoxy organic finish.

Recently, a new class of finishes has emerged in which one or more of the layers are applied by PVD. Typically, the final layer is a compound of metal, usually titanium or zirconium, with nitrogen and/or carbon. Usually, the final layer of metal/nitrogen/carbon compound is applied over a strike layer of PVD metal from which the nitrogen and carbon are absent. Just as in the electroplated case, the function of the strike layer is to promote good adhesion. PVD coating is normally performed under vacuum pressures of approximately $10^{-3}$ to $10^{-2}$ millibar. To further promote adhesion, the surface to be coated is first washed clean of contaminants such as grease and is further pre-cleaned in the vacuum chamber by ion bombardment to remove a small thickness of material including any surface oxide layer. The PVD coating process imparts heat to the article being coated, which reaches a temperature of at least 100° C. and usually a temperature between 150° C. and 900° C. The article to be coated may be preheated prior to PVD coating.

PVD finishes are preferred over other kinds because the PVD materials are generally chemically inert and resist corrosion. The surface is extremely hard and the finish can be applied in a range of colors. For example, a brass-colored PVD finish is disclosed in the above-referenced patents. Unfortunately, the PVD finishes are frequently discontinuous and do not confer any additional corrosion resistance on the substrate. Consequently, a standard chrome electroplating system is frequently furnished under the PVD layer as a corrosion barrier. Additionally, some PVD finishes, such as TiN, have been shown to degrade the performance of the underlying corrosion protection system. For this reason, corrosion protection systems other than chrome have been proposed as ideal for PVD finishes and such are described in the above-mentioned Baldwin Hardware patents. All of the proposed systems rely on the perfect noble barrier concept described above rather than the "balanced system" concept in which the cathode and anode areas are not too dissimilar, their potentials are not too different, and neither has an inherent tendency to corrode at a high rate.

It is clear that a PVD coating process may violate the "balanced protection" concept in three ways. First, the passivating chrome oxide layer is removed, or at least, breached; second, the cell voltage available to drive corrosion is increased, since PVD nitride layers are more noble than chromium; and third, under heat and vacuum most castings, and especially zinc die castings, are likely to emit some gas. The gas may be derived from porosity in the casting, or from plating solutions trapped within the electroplate layers or absorbed into surface defects on the casting, such as surface exposed porosity or cracks, for example "cold shuts." Whatever the source of the gas, its emission into the vacuum is likely to breach the protective nickel/chrome layers and create a pathway which will expose zinc to the corrosive environment.

It has been determined that when exposed at room temperature to salt water, ZrN coatings on stainless steel react with water to form a passivating film on the ZrN and prevent corrosion of the steel. Thus, ZrN and ZrCN coatings become effectively passive and are able to fulfill the function formerly provided by the chrome oxide passive layer. In contrast, TiN coatings do not passivate so efficiently and are less effective as a corrosion barrier. In general, zirconium and titanium react with nitrogen similarly to form a range of electrically conducting compounds and solid solutions, but the Zr—N system contains an unusual insulating compound, Zr3N4, which has no known analogue in the Ti—N system, or in any other metal-N chemical system other than Hf—N. It has been determined that ZrN PVD coatings do not degrade the corrosion performance of chrome-plated decorative zinc die castings in salt spray tests, whereas, PVD coatings which contain appreciable amounts of titanium, chromium, or titanium and aluminum, do degrade the performance. It is believed that the advantageous passivation behavior of ZrN coatings in water is correlated to the ability to form the unusual Zr3N4 phase and that HfN-based PVD coatings also have similar acceptable corrosion performance.

The prior art suggests that the presence of titanium, chromium or titanium/aluminum, is required to achieve colors other than brass in PVD finishing. Chromium is frequently used to obtain a gray color similar to pewter; titanium is used to obtain a gold color; and titanium/aluminum is used to obtain a black color. Given the above-described fundamental violation of balanced protection introduced by PVD finishing processes, it has been determined that the corrosion protection systems proposed in the prior art will be ineffective in mass production. In fact, when a breach is created in one of the noble metal barrier corrosion protection systems by outgassing under vacuum, the expected result is a severe and pernicious case of the "large cathode area effect." The corrosion protection strategies in the prior art are further limited because they are expensive, difficult to control in production, and are available only from specialist vendors of electroplating services.

The present invention provides corrosion protection in a PVD finish and does so in a manner to create colors other than brass. The metal species in the outer coating is only chosen from zirconium and hafnium. The process parameters of the PVD process are controlled in a manner to provide the desired colors.

Focusing on the drawing, which is a partial section of an article manufactured in accordance with the present disclosure, the substrate is indicated at 10 and preferably is of a material which is essentially free of surface flaws and porosity. It is preferably chosen from the group comprising brass, a metal glass, and zinc castings produced by dual phase casting (DPC), also known as semi-solid casting, slush casting or thixoforming. Semi-solid casting is advantageous because it creates castings which are essentially free from gas porosity and have zero or at least minimal shrinkage porosity. This process is relatively inexpensive and semi-solid cast zinc can be readily substituted for zinc die castings formed from existing die casting molds. Semi-solid cast brass is also an acceptable product material for the substrate, as is semi-solid cast magnesium. The low pressure permanent molding process, like semi-solid casting, creates less porosity than pressure die casting and may be used to form substrates of brass, which substrates will again have less porosity than conventional zinc die casting.

Directly adjacent the substrate 10 is the corrosion protection layer 12 which may be one or more layers of copper, nickel and chromium. Such corrosion protection layers are well known in the art and there may be one such layer or more. Alternatively, the corrosion protection layer may be chosen from one of the group comprising nickel; duplex nickel, nickel/palladium; nickel, tungsten and boron; or nickel and tin. All of these corrosion protection layers are detailed in the prior art referenced above. The particular corrosion protection layer may vary, although economics may dictate the use of a conventional copper, nickel and chromium layer. The thickness of the layer 12 will vary depending on the specific materials that are used. As an example, the combination of cyanide copper, acid copper, duplex nickel and chrome should have a minimum thickness of about 35 microns and a nominal thickness of about 48 microns.

Adjacent to the corrosion protection layer 12 is an insulating layer 14 which is electrically non-conducting or at least has a very high electrical resistance. The insulating layer may be chosen from the group consisting of oxides of Ti and Zr, $SiO_2$, $SiO_xC_yH_z$, $Al_2O_3$, $AlO_xC_yH_z$, $Zr3N4$, $Zr_xN_yC_z$, $Hf3N4$ or $Hf_xN_yC_z$, or other metals which form insulating compounds isostructural with $Zr3N4$. This layer may be applied by a PVD process. In the alternative the insulating layer 14 may be outside of or on the exterior of the article, on top of the decorative outer coating 18 or embedded within the decorative outer coating. The non-conducting layer is important, but its position may be varied within the final stack of layers in the article. The preferred nominal thickness for the insulating layer is one micron with a minimum thickness of 0.5 micron. Below the lower limit, the insulating layer will not be continuous and if the thickness is substantially greater than nominal, the layer will be uneconomical to apply and will tend to fracture under internal stress.

Between the insulating layer 14 and the outer decorative coating there is a strike or adhesive layer 16 formed of compounds of Zr and/or Ti. The layer 16 should have a minimum thickness of about 0.025 micron and a nominal thickness of about 0.05 micron.

The outer layer 18 provides the desired decorative color and will be applied with the process parameters set forth in the following table and will be chosen from the group consisting only of ZrN, ZrCN, HfN and HfCN. It should have a minimum thickness of about 0.015 micron and a nominal thickness of about 0.35 micron. Those skilled in the art of PVD deposition recognize that the term ZrN refers not simply to the compound $Z_1N_1$, but rather to a film containing principally the atomic species Zr and N. Similarly, ZrCN denotes a film containing the species Zr, C and N and $SiO_xC_yH_z$, is a film containing the species Si, O, C and H.

| Color | Gray | | | Gold | | Black | | |
|---|---|---|---|---|---|---|---|---|
| Conventional finish analog | Pewter, stainless steel | | | 24 kt gold, gold plate | | Black nickel, black chrome, gunmetal | | |
| Color ranges for (L*, a*, b*) | +55:+100; −1:+4; .5:−10 | | | +55:+100; +2:+8; +16:+36 | | +1:+48; −2:+2; −10:+10 | | |
| Moen PVD finishing recipe (Hauzer HTC 1500 equipment) | 1 | 2 | 3 | 4 | 5 | 6 | 7 | 8 |
| Color (L*, a*, b*) | 79; 0.6; 5 | 79; 1.2; 6 | 79; 0.6; 5 | 74; 6; 30 | 77; 4; 23 | 44; 0.5; 0.6 | 48; 0.7; 0.8 | 43; 0.5; 3 |
| Chem. species in top layer of PVD film | Cr, C, N | Ti, C, N | Zr, C, N | Ti, C, N | Zr, C, N | Ti, Al, C, N | Ti, C, N | Zr, C, N |
| Corrosion test results (96 hour NSS, ASTM B117) | Fail | Fail | Pass | Fail | Pass | Fail | Fail | Pass |
| Target material | 2 Cr | 2 Ti | 2 Zr | Ti Zr | Zr | 2 Ti Al | Ti | 2 Zr |
| Cathode power (kw) | 4.2 | 3.6 | 3.8 | 3.8; 1.9 | 2; 120 | 2.16 | 3.8 | 8 |
| N2 gas flow rate (SCCM) | 50 | 75 | 15 | 1800 | 400 | 550 | 1000 | 15 |
| C2H2 gas flow rate (SCCM) | 100 | 50 | 30 | 20 | 20 | 50 | 20 | 85 |
| Argon flow rate (SCCM) | 1000 | 0 | 1200 | 0 | 800 | 0 | 0 | 750 |
| Bias (V) | 70 | 70 | 60 | 60 | 60 | 10 | 60 | 70 |

As is known, the measurement of color is determined by three specific parameters in which "L" is a measure of the lightness of an object, "a" is a measure of the redness (positive) or greenness (negative), and "b" is a measure of yellowness (positive) or blueness (negative). These three parameters, together, define a specific color.

As is indicated in the above table, when zirconium was the principal component of the color producing PVD outer coating, the article passed a standard corrosion test, whereas, when chromium, titanium or aluminum were the principal components, such was not the case. Thus, it has been determined that only zirconium and hafnium provide the desired corrosion resistant article. It is believed that compounds of Zr and Hf are superior because these components are able to form a passivating oxide layer which can effectively replace the passivating chrome oxide layer removed or breached by the prior ion etching process, and can be deposited in forms which have extremely high electrical resistivity. The same is not true of other metals, principally because their PVD nitride compounds do not passivate as effectively as ZrN or ZrCN and they are incapable of forming the $Zr_3N_4$ component or its equivalent. The $Zr_3N_4$ component appears to be highly necessary in order to create high resistivity in the PVD layer, and is believed to be responsible for the superior passivating behavior of ZrN PVD films in salt water as contrasted with TiN PVD films.

It should be understood that even though titanium is excluded from the PVD outer coating in the present invention, as are other metals, there may be minute traces of these materials simply because there are targets made of such materials within the PVD chamber, as such may be used as a part of the strike layer.

Whereas the preferred form of the invention has been shown and described herein, it should be realized that there may be many modifications, substitutions and alterations thereto.

The embodiments of the invention in which an exclusive property or privilege is claimed are defined as follows:

1. A new article of manufacture which has a specified decorative color, other than brass, and which is resistant to corrosion, abrasion and attack by chemicals, said article including:
   a) a substrate;
   b) at least one corrosion resistant layer;
   c) an outer layer, applied by PVD, and chosen from one or more of only Zr, N, C and Hf, which layer provides the desired, other than brass, color of the article and the desired chemical and abrasion resistance, and which layer, when in contact with air or water, forms a substantially non-conducting passive film that is effective in preventing corrosion during standard salt spray testing.

2. The article of claim 1 further including a non-conducting layer adjacent said outer layer and chosen from the group consisting of oxides of Ti and Zr, $SiO_2$, SiOxCyHz, $Al_2O_3$, AlOxCyHz, Zr3N4, ZrxNyCz, Hf3N4 or HfxNyCz, or other metals which form insulating compounds isostructural with Zr3N4.

3. The article of claim 2 wherein said non-conducting layer is between said corrosion resistant layer and said outer layer.

4. The article of claim 2 wherein said non-conducting layer is outside of said outer layer.

5. The article of claim 2 wherein said non-conducting layer is embedded within said outer layer.

6. The article of claim 1 further including a strike layer, applied by PVD, to increase adherence of the outer layer to the corrosion resistant layer.

7. The article of claim 6 wherein said strike layer includes Zr, and/or Ti.

8. The article of claim 1 wherein the substrate is essentially free of surface flaws and porosity and is chosen from the group comprising brass, a metal glass, and semi-solid cast zinc.

9. The article of claim 1 wherein the corrosion resistant layer includes nickel.

10. The article of claim 9 wherein said corrosion resistant layer includes a first layer comprised of semi-bright nickel and a second layer comprised of bright nickel disposed over said first layer of semi-bright nickel.

11. The article of claim 1 wherein said corrosion resistant layer includes an alloy of nickel and palladium.

12. The article of claim 1 wherein said corrosion resistant layer includes an alloy of nickel, tungsten and boron.

13. The article of claim 1 wherein said corrosion resistant layer includes an alloy of nickel and tin.

14. The article of claim 1 wherein said specified decorative color is gray and the outer layer includes zirconium as the target material for the PVD process.

15. The article of claim 14 wherein the gray color is defined by a value for "L" of approximately 79, a value for "a" of approximately 0.6, and a value for "b" of approximately 5.

16. The article of claim 1 wherein said specified decorative color is gold and the outer layer includes zirconium as the target material for the PVD process.

17. The article of claim 14 wherein the gold color is defined by a value for "L" of approximately 77, a value for "a" of approximately 4, and a value for "b" of approximately 23.

18. The article of claim 1 wherein said specified decorative color is black and the outer layer includes zirconium as the target material for the PVD process.

19. The article of claim 14 wherein the black color is defined by a value for "L" of approximately 43, a value for "a" of approximately 0.5, and a value for "b" of approximately 3.

20. The article of claim 1 wherein said passive film includes $Zr_3N_4$ or its Hf equivalent.

* * * * *